FEEDBACK AMPLIFIER

Filed May 31, 1960

INVENTOR.
PATRICK F. HOWDEN
BY Christie, Parker & Hale
ATTORNEYS.

United States Patent Office
3,299,367
Patented Jan. 17, 1967

3,299,367
FEEDBACK AMPLIFIER
Patrick F. Howden, Monrovia, Calif., assignor to SDS Data Systems, a corporation of California
Filed May 31, 1960, Ser. No. 32,953
8 Claims. (Cl. 330—104)

This invention relates to electrical circuits and more particularly to electronic feed-back amplifiers.

Space vehicles such as rockets may be equipped with instrumentation such as a mass spectrometer, for detecting the amount of a particular type of ion in the atmosphere and for developing a corresponding output current. A subcarrier oscillator is coupled to the output current and forms a corresponding signal superimposed on a high frequency carrier. The resultant carrier signal is then transmitted to earth. A mass spectrometer usually has a high impedance, low current output, and a subcarrier oscillator usually has a low input impedance and requires a relatively high current for excitation. Space vehicles undergo rapid changes in height therefore causing the frequency with which the ions are collected and internal temperature to vary over a wide range. Thus, an amplifier is required to amplify the output current of the mass spectrometer and to apply the amplified current signal to the input of the subcarrier oscillator, and from the above discussion the amplifier must have a very high current gain, a very high input impedance, a low output impedance, and a large frequency band width. In addition, the gain of the amplifier must be stable, free of noise and independent of temperature variations.

Amplifiers capable of meeting the gain, input impedance and stability requirements, generally have much too narrow a band width, and those capable of meeting the frequency requirements are generally unstable and have low input impedance and gain.

High gain amplifiers using a degenerative feed-back circuit have been used in similar applications. One example is where a high gain amplifier is used with a single feed-back resistor connected from output to input, the amplification being high enough that the output voltage is dependent only upon the value of the feed-back resistor and input current. This type of amplifier is called an operational amplifier. Input capacitance, due to cabling connected to the input of the amplifier and amplifier input capacities, and stray resistive capacitance, across the feed-back resistor from output to input, cause a serious frequency limitation in operational amplifiers. To overcome the resistive capacitance in operational amplifiers, an integrating circuit has been added to the output of the amplifier, the feed-back resistance connected to the output of the integrating circuit and the integrating circuit adjusted to disable the effect of the feed-back, and thereby reduce the effect of the resistive capacitance, as frequency increases. Disadvantages of this type of arrangement are that input capacity is not entirely eliminated, and there is a very low upper cutoff frequency. Also, feedback is decreased as frequency increases, causing a decrease in stability and increase in noise at the output of the amplifier.

To overcome the effects of both the input capacitance and resistive capacitance on an operational amplifier, without the use of an integrating circuit, a positive feed-back circuit employing a capacitor has been used which, in effect, cancels out the undesired capacities at the input of the operational amplifier. Disadvantages of this arrangement are that adjustment of the positive capacitive feedback is extremely critical and the amplifier tends to become oscillatory.

A preferred embodiment of the present invention is free of the above mentioned defects and, briefly, provides a positive gain amplifier, for amplifying low level input signals and for developing output signals in phase with the input signals. A negative gain amplifier is provided for amplifying the output signal of the positive gain amplifier and for developing output signals 180° out of phase with the output signal of the positive gain amplifier. An integrating circuit is connected to the output of the negative gain amplifier and a degenerative feed-back circuit is connected between the output of the integrating circuit and the input of the positive gain amplifier. The time constant of the integrating circuit is adjusted until equal to the time constant of the resistive feedback and associated stray resistive capacitance. A capacitive feed-back circuit is connected between the output of the positive gain amplifier and its input so as to provide regenerative feedback, and the amount of capacitive feedback is adjusted until the effective input capacitance is zero.

In addition to the features mentioned above, the amplifier of the invention may be operated with a minimum number of low power sources of potential (such as a battery) by the use of a novel circuit arrangement for the negative gain amplifier. The negative gain amplifier according to the invention has a vacuum tube for regulating current only to the base of a first transistor. A second transistor is connected to the first transistor for providing a low impedance output signal. The transistors are then reversed biased such that current flows in the collector and emitter electrodes in a reverse direction. Such a circuit arrangement alleviates the need of a plate power supply for the vacuum tube, thereby allowing the transistor amplifiers to operate from a single low power source of potential, and the transistors provide a voltage divider between the plate of the tube and the output circuit.

These and other features of the present invention may be more fully appreciated when considered in the light of the following specification and drawings, in which.

Figures 1, 2, 3:
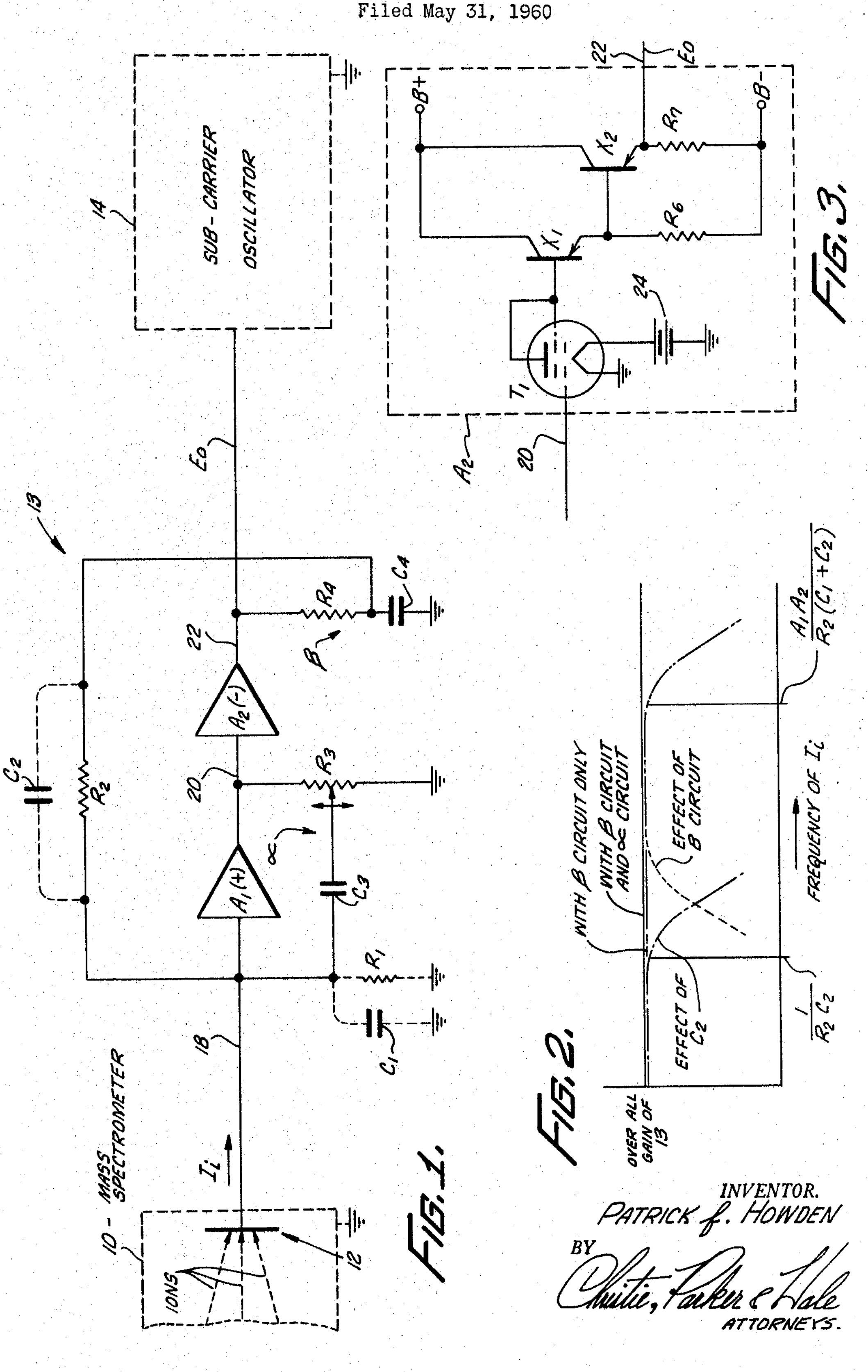
FIG. 1 is a schematic block drawing of an amplifier embodying the invention.
FIG. 2 is a graph showing the frequency response of the amplifier in FIG. 1 with and without feedback.
FIG. 3 is a schematic diagram of the negative gain amplifier shown in FIG. 1.

Referring now to FIG. 1, the output of a mass spectrometer 10 is connected to the input of operational amplifier 13, and the output of operational amplifier 13 is in turn connected to the input of a subcarrier oscillator 14. Ions are collected by collector 12 of mass spectrometer 10 and the resulting current represented by the symbol $I_1$, amplified by operational amplifier 13.

Operational amplifier 13 has a positive gain amplifier $A_1$ and a negative gain amplifier $A_2$, arranged with the input of amplifier $A_1$ connected to collector 12 by lead 18, the output of amplifier $A_1$ connected to the input of amplifier $A_2$ by lead line 20 and the output of amplifier $A_2$ connected to the input of subcarrier oscillator 14.

An integrating circuit, called a $\beta$ circuit, has a resistor $R_4$ and capacitor $C_4$ serially connected between line 22 and ground resistor $R_4$ being connected to line 22 and capacitor $C_4$ connected to ground. A degenerative feedback circuit is provided by resistor $R_2$, connected from the junction of resistor $R_4$ and capacitor $C_4$ to lead 18. A regenerative or capacitive feed-back circuit, called an $\alpha$ circuit, has a capacitor $C_3$ and a variable resistor $R_3$, resistor $R_3$ being connected between line 20 and ground and capacitor $C_3$ being connected between a slider on variable resistor $R_3$ and line 18. Capacitance due to cabling, between mass spectrometer 10 and amplifier 13, and input capacitance, due to grid, plate and lead capacitance in amplifier $A_1$, are lumped together and represented by the symbol $C_1$, which is connected by dashed lines between line 18 and ground. Similarly, the stray capacitance across resistor $R_2$ referred to as resistive capacitance, is represented by the symbol $C_2$ and is shown in dashed lines. Impedance $R_1$ is the input leakage impedance of amplifier $A_1$ plus the leakage impedance of line 18, and is connected from line 18 to ground by dashed lines.

When the frequency of input current $I_i$ is zero, $I_i$ flows from collector 12, in line 18 to the input of amplifier 13. The current $I_i$ divides, part flowing through $R_1$ and part through feedback resistor $R_2$. The impedance of resistors $R_2$ and $R_4$ are low compared with the impedance $R_1$. Therefore it is assumed $I_i$ flows entirely through resistor $R_2$. Since the combined gain of amplifiers $A_2$ and $A_1$ is very high, the resistive feed-back circuit makes the output voltage on line 22, $E_o$, essentially $I_iR_2$, a well-known feature of operational amplifiers.

The operation of the amplifier 13, as frequency is increased, is best understood by considering the effect of the individual feed-back circuits on gain and by reference to FIG. 2.

First, assume that the $\beta$ circuit and the $\alpha$ circuit are removed, feed-back resistor $R_2$ is connected to output line 22, and the frequency of input current $I_i$ starts increasing from 0 cycles per second. As frequency increases, the gain of amplifier 13 is constant until an upper cutoff frequency of $1/R_2C_2$ is reached where overall gain starts to drop off. This is due to the effect of capacitance $C_2$, which starts to short out feed-back resistor $R_2$, and is illustrated in FIG. 2 by dashed lines.

Second, assume that the $\beta$ circuit is connected to the output of operational amplifier 13, as shown, and the $\alpha$ circuit is removed. The optimum values of $R_2$, $R_4$, and $C_4$ to give maximum band width are given by the equation $R_2C_2=R_4C_4$. Therefore, assume resistor $R_4$ and capacitor $C_4$ are adjusted to satisfy this relationship, and that the frequency of input current $I_i$ starts to increase. At the upper cutoff frequency $1/R_2C_2$ gain of the amplifier starts to drop off due to the shorting effect of stray capacitance $C_2$. However, at this frequency the $\beta$ integrating circuit starts to introduce a lag in the feed-back signal through $R_2$ reducing the amount of feedback and therefore reducing the deteriorating effect of stray capacitance $C_2$. The effect of the $\beta$ circuit is indicated in FIG. 2 by dashed lines, where it is also indicated by a broken line, that the gain of the amplifier 13 remains essentially constant due to the combined effects of $C_2$ and the $\beta$ circuits over a limited range of frequencies. At an upper cutoff frequency, which may be defined as $$\frac{A_1A_2}{R_2(C_1+C_2)}$$

the gain of amplifier 13 starts to drop off again due to the combined effects of $C_1$, $C_2$ and amplification of amplifiers $A_1$ and $A_2$.

Third, assume the amplifier circuit is complete as shown in FIG. 1. Analysis of the circuit shows the optimum relationship of $R_2$, $R_4$, $C_4$ is again given by the equation $R_2C_2=R_4C_4$ for maximum band width. Then, in order to extend band width further, $C_3$ should be adjusted to satisfy the equation given by $$C_2=\frac{C_1+C_2}{aR_3A_1A_2}$$

where $a$ represents the ratio of the resistance of resistor $R_3$ below the slider to the total resistance of $R_3$.

With the above value for $C_3$ and at a frequency of about $$\frac{A_1A_2}{R_2(C_1+C_2)}$$

the $\alpha$ circuit becomes effective to start introducing an effective negative capacitance at the input of $A_1$ to ground. Since the output impedance of amplifier $A_2$ is very low, capacitance $C_2$ is also effectively connected between the input of amplifier $A_1$ and ground. Therefore, by adjusting the slider of variable resistor $R_3$ (changing $a$), the effective negative capacitance can be adjusted to cancel out the capacitance of $C_1$ and $C_2$. As a result, the upper cutoff frequency of the amplifier is extended above the upper cutoff frequency given by the equation $$\frac{A_1A_2}{R_2(C_1+C_2)}$$

and yet the integrating circuit allows the capacitive feedback to be adjusted easily and provides stability. Another important feature of the $\alpha$ circuit is that it greatly reduces noise at the output of amplifier 13.

In a preferred embodiment, the values of the components in FIG. 1 are as follows:

$R_2=1\times10^{12}$ ohms $\quad C_3=.03\ \mu\mu f.$
$R_3=8\times10^{6}$ ohms $\quad C_4=.1\ \mu\mu f.$
$R_4=2\times10^{6}$ ohms
Gain of $A_1=400$
Gain of $A_2=100$ This arrangement gives an upper cutoff frequency of about 1000 cycles per second.

FIG. 3 is a preferred circuit diagram for the negative gain amplifier $A_2$ of FIG. 1, having a vacuum tube $T_1$ for controlling current to the base of a PNP transistor $X_1$. Tube $T_1$ is connected as a triode, the plate and suppressor grid being connected to the base of PNP transistor $X_1$, the screen grid being connected to line 20, and the cathode being connected between ground and the positive side of a source of potential 24, which is referenced to ground. Transistor $X_1$ has its emitter connected to the base of a PNP transistor $X_2$. Transistors $X_1$ and $X_2$ are arranged with their collectors connected to a positive source of potential B+, their emitters connected to a negative source of potential B− through resistors $R_6$ and $R_7$, respectively, and the emitter of transistor $X_2$ connected to output line 22.

Two important arrangements are to be noted. First, the base of transistor $X_1$ delivers all the current received by the plate of tube $T_1$, and second, a positive potential is connected to the collectors of the PNP transistors $X_1$ and $X_2$ with respect to the emitters. Thus, current flows from collector to emitter of the PNP transistor rather than in the conventional emitter to collector direction. In the preferred embodiment of the invention, vacuum tube $T_1$ is operated in a low current range so that the base of transistor $X_1$ is in a starved current condition. The features of such an amplifier arrangement are that amplifier $A_2$ provides a high impedance to input signals (on line 20) due to the high grid impedance of vacuum tube $T_1$, whereas transistors $X_1$ and $X_2$ provide a very linear, amplifier with high gain and low output impedance. In addition, the transistors provide a voltage divider to the relatively high potential at the base of transistor $X_1$ and thereby divide the potential down so that 0 volt output signal may be obtained.

In a preferred embodiment, transistors $X_1$ and $X_2$ are RCA type 2N 398's and the vacuum tube $T_1$ is an RCA type CK 628.

Referring to FIG. 1 once again, and assuming the components indicated above for amplifier $A_2$ as well as the other component values of amplifier 13 given above, when the input current $I_1$ is zero, amplifier $A_2$ is adjusted such that voltage on the base of transistor $X_1$ is about 24.72 v. and the output voltage $E_0$ about −28 v. When the input current $I_1$ is $10^{-12}$ micro-amperes, full input current, the potential on the base of transistor $X_1$ is about 25.28 v. and the output voltage $E_0$ is about +28 v.

Thus it is seen the amplifier 13 of FIG. 3 provides a negative gain amplifier which requires very low sources of power for operation and for use in the amplifier of FIG. 1.

What is claimed is:

1. A high gain amplifier, comprising: a positive gain amplifier for receiving a low level input signal and for providing an output signal proportional thereto; a negative gain amplifier connected to be responsive to the output signal from said first amplifier for providing an output signal proportional thereto; an integrating circuit connected for integrating the output signal of said negative grain amplifier; a degenerative feedback circuit for coupling the integrated signal from said integrating circuit to the input of said first amplifier; and a capacitive feedback circuit connected for applying a signal proportional to the output signal of said positive gain amplifier to the input of said positive gain amplifier the integrating circuit and capacitive feedback circuits thereby cooperating to compensate for deleterious capacitance in the amplifiers for causing the amplifiers to form a stable amplifier with high gain and wide band width characteristics.

2. A high gain amplifier as defined in claim 1 wherein said capacitive feedback circuit comprises an adjustable voltage divider connected to the output of said first amplifier and a capacitive element connected between said voltage divider and the input circuit of said first amplifier to thereby provide an adjustable regenerative feedback circuit.

3. An amplifier, comprising a plurality of stages of amplification including an input circuit for each of said stages, at least one input circuit coupled for receiving input signals applied thereto, at least one stage for developing an output signal substantially in phase with the applied input signals and at least one stage for developing an output signal substantially 180° out of phase with the applied input signals, first feedback means coupled for feeding back the output signal 180° out of phase with the applied input signals to the input circuit of one of said stages, phase shifting means coupled to the output signal 180° out of phase with the applied input signals and to said first feedback means for decreasing the amount of feedback provided thereby as the frequency of the applied input signals increase for partially compensating for stray capacitance across the first feedback circuit, and corrective feedback means having a predominantly capacitive component coupled for feeding back the output signal in phase with the applied input signals to one of said stages and arranged in cooperation with the phase shifting means for causing the overall gain of the stages of amplification to be substantially constant for input signals having frequencies from substantially direct current to very high frequencies.

4. An amplifier, comprising a plurality of stages of amplification including an input circuit at one stage connected for receiving input signals applied thereto, at least one stage for developing an output signal substantially in phase with the applied input signals, and at least one stage for developing an output signal substantially 180° out of phase with the applied input signals, a first feedback circuit connected for feeding back the output signal 180° out of phase with the applied input signals to said input circuit, an integrating circuit connected for integrating the output signal 180° out of phase with the applied input signals for partially compensating for stray capacitance across said first feedback circuit, and a second feedback circuit having a predominantly capacitive component coupled for feeding back the output signal which is in phase with said input signal to said input circuit and arranged for cooperating with said integrating circuit for providing a substantially constant overall gain through the amplification stages for input signals having frequencies from substantially direct current to very high frequencies.

5. An alternating current signal amplifier, comprising a plurality of stages of amplification including an input circuit at one stage connected for receiving input signals applied thereto, at least one stage for developing an output signal substantially in phase with the applied input signals and at least one stage for developing an output signal substantially 180° out of phase with the applied input signals, a first feedback circuit coupled for feeding back the output signal 180° out of phase with the applied input signals to said input circuit, an integrating circuit connected to said first feedback circuit and coupled to be responsive to the output signal 180° out of phase with the applied input signals for adjusting the amount of feedback by said first feedback circuit proportional to the frequency of the applied input signals to thereby partially compensate for stray capacitance across said first feedback circuit, a corrective feedback circuit having a predominantly capacitive component coupled for feeding back to said input circuit the output signal in phase with the applied input signal and arranged for cooperating with said integrating circuit for causing the stages of amplification to provide an effective overall amplified signal having a gain which is substantially independent of the frequency of input signal from substantially direct current to very high frequencies.

6. An alternating current signal amplifier as defined in claim 5 wherein said corrective feedback circuit comprises an adjustable voltage divider coupled to the signal 180° out of phase with the applied input signal and a capacitive element connected between said voltage divider and said input circuit to thereby provide fine adjustments in the capacitive feedback.

7. An amplifier having a plurality of stages of amplification including at least one stage having an input circuit for receiving applied input signals, at least one stage for providing an output signal substantially in phase with the applied input signals, and at least one stage for providing an output signal substantially 180° out of phase with the applied input signals, the improvement comprising the combination of a corrective feedback circuit having a predominantly capacitive impedance coupled to said input circuit and coupled to be responsive to the output signal in phase with the applied input signal for providing a feedback signal to said input circuit, an integrating circuit coupled for integrating the output signal 180° out of phase with the applied input signal, and a second feedback circuit coupled between said integrating circuit and said input circuit for applying the integrated signal to said input circuit, the corrective feedback circuit and integrating circuit being arranged in cooperation for compensating for deleterious stray capacitance and thereby cause an improved amplifier having a stable gain and substantially flat frequency response characteristic from essentially direct current to high frequency input signals.

8. An amplifier for amplifying low level alternating current signals from a high impedance source of signals and for providing a low impedance output signal including a plurality of stages of amplification having at least one input circuit for receiving applied input signals, at least one stage for providing an output signal substantially in phase with the applied input signals, and at least one stage for providing an output signal substantially 180° out of phase with the applied input signals, the improvement being an improved feedback circuit for compensating for stray capacitance in the amplifier and to provide for fine adjustments in the amount of feedback comprising the combination of an adjustable capacitive feedback circuit coupled to said input circuit and coupled to be responsive to the output signal in phase with the applied input signal for providing corrective signals to said input circuit, an integrating circuit coupled for integrating the output signal 180° out of phase with the applied input signal, and a second feedback circuit coupled between said integrating circuit and said input circuit for applying the integrated signal to said input circuit, and thereby cooperate with the capacitive feedback circuit to provide a wide band width amplifier having a substantially constant gain starting at substantially a direct current input signal.

References Cited by the Examiner

UNITED STATES PATENTS

| | | | |
|---|---|---|---|
| 2,240,600 | 5/1941 | Applegrath | 325—400 X |
| 2,924,781 | 2/1960 | Wilson et al. | 330—104 |

FOREIGN PATENTS

| | | |
|---|---|---|
| 111,828 | 10/1940 | Australia. |

NATHAN KAUFMAN, *Primary Examiner.*

E. JAMES SAX, K. O. CORLEY, *Assistant Examiners.*